United States Patent
Liu et al.

(10) Patent No.: US 7,215,573 B2
(45) Date of Patent: May 8, 2007

(54) METHOD AND APPARATUS FOR REDUCING OPERATION DISTURBANCE

(75) Inventors: Tseng-Yi Liu, Hsin-Chu (TW); Prateep Tuntasood, San Jose, CA (US); Ben Sheen, Milpitas, CA (US)

(73) Assignee: Silicon Storage Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/212,206

(22) Filed: Aug. 25, 2005

(65) Prior Publication Data

US 2007/0047298 A1   Mar. 1, 2007

(51) Int. Cl.
*G11C 11/34* (2006.01)

(52) U.S. Cl. ............................ 365/185.02; 365/185.05; 365/185.11

(58) Field of Classification Search ........... 365/185.02, 365/185.05, 185.11, 185.18, 185.28, 185.29, 365/185.33
See application file for complete search history.

(56) References Cited

U.S. PATENT DOCUMENTS

| | | | | |
|---|---|---|---|---|
| 5,612,913 A | * | 3/1997 | Cappelletti et al. .... | 365/185.18 |
| 6,222,773 B1 | * | 4/2001 | Tanzawa et al. ........ | 365/185.28 |
| 6,222,775 B1 | * | 4/2001 | Cappelletti ............. | 365/185.29 |
| 6,256,702 B1 | * | 7/2001 | Yoneyama ............. | 365/185.33 |
| 6,456,530 B1 | * | 9/2002 | Micheloni et al. ..... | 365/185.18 |
| 6,560,144 B2 | * | 5/2003 | Atsumi et al. ......... | 365/185.11 |
| 6,822,287 B1 | | 11/2004 | Lee et al. | |

\* cited by examiner

Primary Examiner—Trong Phan
(74) Attorney, Agent, or Firm—DLA Piper US LLP (57) ABSTRACT

A memory array has a plurality of memory cells, arranged in a plurality of rows and columns. Each cell has at least four terminals. The array has a plurality of column lines with each column line connected to a first terminal of a different column of cells. The array also has a plurality of first row lines, with each first row line connected to a second terminal of a different row of cells. The array also has a plurality of second row lines, with each second row line connected to a third terminal of a different row of cells. Finally, the array has a plurality of third row lines with each third row line connected to a fourth terminal of a different row of cells. A column decoder is connected to the plurality of column lines. A first row decoder is connected to the plurality of first row lines. A second row decoder is connected to the plurality of second row lines. A third row decoder is connected to the plurality of third row lines. During an operation of a selected cell, the column decoder selects one of the plurality of column lines, with the one column line selected connected to the first terminal of the selected cell. The first row decoder selects one of the plurality of first row lines with the one first row line selected connected to the second terminal of the selected cell. The second row decoder selects a first plurality of second row lines, with one of the first plurality of second row lines connected to the third terminal of the selected cell. The third row decoder selects a second plurality of third row lines, with one of the second plurality of third row lines connected to the fourth terminal of the selected cell. Finally, the first plurality of second row lines, other than the one second row line, are connected to cells arranged in rows other than rows of cells to which the second plurality of third row lines are connected. The interconnection minimizes programming disturbance.

15 Claims, 5 Drawing Sheets

METHOD AND APPARATUS FOR REDUCING OPERATION DISTURBANCE

TECHNICAL FIELD

The present invention relates to a method and apparatus for reducing operation disturbance, such as programming disturbance, in a non-volatile memory cell array having a plurality of non-volatile memory cells arranged in a plurality of rows and columns; wherein each cell has at least four terminals. More particularly, the present invention reduces program disturbance through the selection of appropriate row lines that connect to the various terminals of the affected and unaffected cells in the same row, and in different rows.

BACKGROUND OF THE INVENTION

Figure 1:
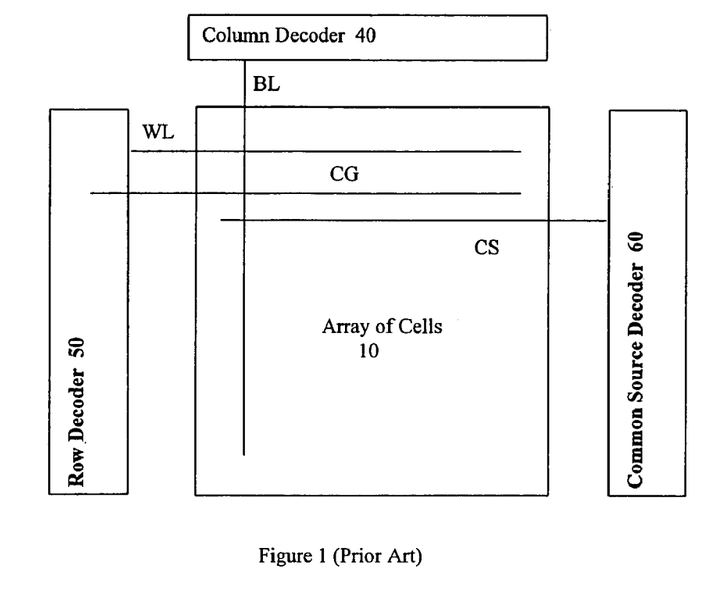
FIG. 1 is a block level diagram of a memory array of the prior art
Figure 2:
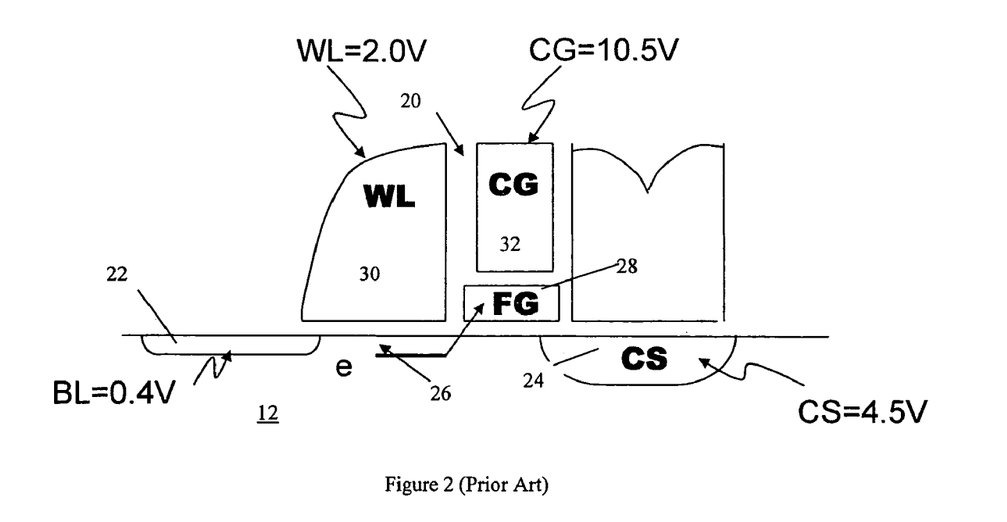
FIG. 2 is a cross-sectional view of a memory cell of the prior art that can be used in the array shown in FIG. 1.

Non-volatile memory cells, in which each cell has at least four terminals, formed in an array are well known in the art. Referring to FIG. 1 there is shown a block level diagram of a memory cell array 10 of the prior art. The array 10 is composed of cells 20 arranged in a plurality of rows and columns. Each cell 20 has a structure whose cross-sectional view is shown in FIG. 2.

The cell 20 comprises a semiconductor substrate 12 of one conductivity type, such as P type. A first region 22 of a second conductivity type is in the substrate 12. A second region 24 of the second conductivity type is also in the substrate 12. The first region 22 and the second region 24 are separated by a channel region 26. A floating gate 28 is spaced apart from the substrate 12 and is insulated from a portion of the channel region 26. A control gate 30 is spaced apart from the substrate 12 and is insulated from another portion of the channel region 26. Finally, a coupling gate 32 is positioned above the floating gate 28 and is capacitively coupled to the floating gate 28.

The connection of the cells 20 in the array 10 is as follows. The cells 20 are arranged in a plurality of rows and columns. As will be appreciated by those skilled in the art, the term "row" and "column" may be used interchangeably. For cells 20 in the same column, a bit line or BL connects the first region 22 of all the cells 20 in the same column. For cells in the same row a word line or WL connects the control gate 30 of all the cells 20 in the same row. In addition, the coupling gate 32 or CG of all the cells 20 in the same row are connected together. Finally, for the cells 20 in the same row, the common source 24 or the second region 24 are connected together.

In the prior art, it is also well known that to address a particular Bit Line, a column decoder 40 receives an address signal and decodes the signal and selects the particular Bit Line. Further, a row decoder 50 receives another address signal and decodes the signal and selects the particular Word Line. The intersection of the particular Bit Line and the particular Word Line selects a unique cell 20 within the array 10, for a particular operation, which can be operations such as erase, program, or read. When a particular Bit Line or a particular Word Line is selected, it is meant that certain voltages are applied to those lines. However, because the cell 20 is a multi-terminal cell 20, i.e. it comprises a plurality (>3) terminals, voltages may also need to be provided to the other terminals of the cell 20. Since the particular cell 20 has been determined by the selection of one particular Bit Line and one particular Word Line, the other lines to the determined cell, such as CS and CG, need not be selected based upon only one single CS line or only one single CG line.

Thus, the decoding of the address signal to select, e.g. the CG line, need not be based upon the decoding of the complete address signal, so long as the selected CG line is one of a plurality of CG lines selected. Thus, as shown schematically in FIG. 1, the CG line is decoded based upon decoding circuit within the row decoder 50, which does not completely decode the address signal. Therefore, a plurality of CG lines, including the CG line connected to the selected cell 20, are all activated at the same time. Similarly, the selected CS line need not be based upon the complete decoding of the address signal, and may be based upon a partial address signal, so long as the selected CS line is one of a plurality of CS lines selected. The benefit of such a scheme is clear. The row decoder 50 (and the common source decoder 60) to decode the address signal for the CG and CS lines do not have to be complete decoders, thereby saving circuitry, resulting in less area needed for these peripheral (outside of the main cell array 10) circuits.

Figure 3:
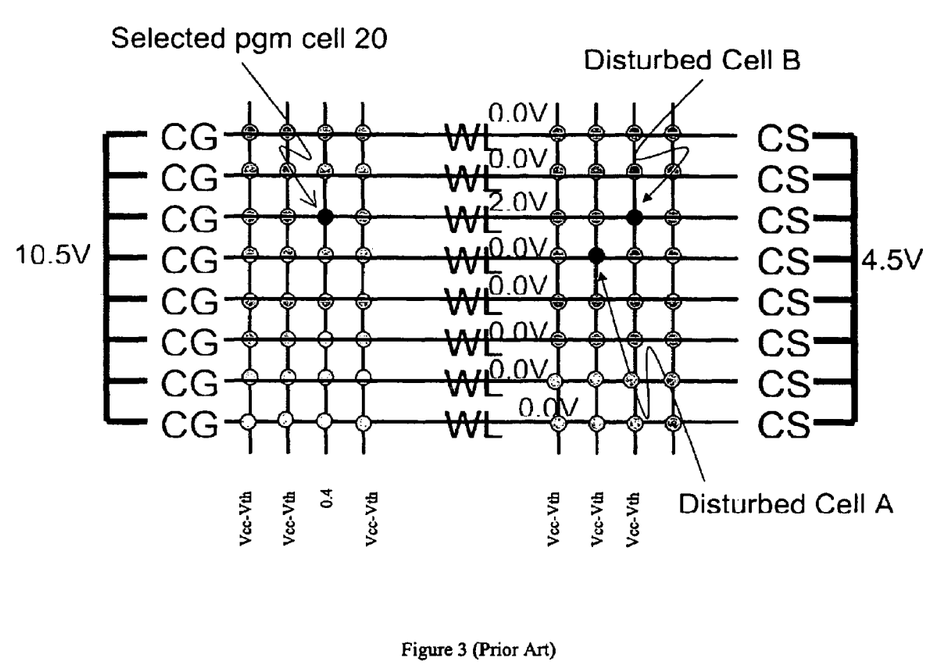
FIG. 3 is partial schematic view of the voltages applied to various lines connected to a selected memory cell of the prior art shown in FIG. 1, showing the program disturbance on various non-selected cells.

Referring to FIG. 3, there is shown a schematic circuit diagram of a portion of the array 10 with the voltages showing the programming of the array 10 of a particular cell 20. As shown in FIG. 3, the particular cell 20 to be programmed (labeled as "Selected pgm cell 20" shown in FIG. 3) is applied with the following voltages: BL=0.4 volts; WL=2.0 volts. All the non-selected BL have a voltage of Vcc-Vth. All the non-selected WL have a voltage of 0.0 volts. The CG line to the Selected pgm cell 20, along with 7 other CG lines to the non-selected cells are supplied with the voltage of 10.5 volts. The CS line to the Selected pgm cell 20, along with 7 other CS lines to the non-selected cells are supplied with the voltage of 4.5 volts.

Selected cell: BL=0.4 v; WL=2.0v; CG=10.5 v; CS=4.5 v

Non-selected cell in a different row, such as cell labeled as "Disturbed Cell A" (hereinafter referred to simply as "cell A") shown in FIG. 3: BL=Vcc-Vth v; WL=0.0v; CG=10.5 v; CS=4.5 v Non-selected cell in the same row, such as cell labeled as "Disturbed Cell B" (hereinafter referred to simply as "cell B") shown in FIG. 3: BL=Vcc-Vth v; WL=2.0v; CG=10.5 v; CS=4.5 v During programming electrons are injected onto the floating gate 28 from the channel region 26. However, with the foregoing voltages, during programming operation, and because of the structure of the cell 20, the program disturbance (for reverse program tunneling from the WL to the Floating Gate) to Cell A is worst than the program disturbance to Cell B.

Accordingly there is a need to minimize program disturbance, or other operational disturbance on the memory array 10 without unduly increase the decoding circuit required.

Finally, interleaving of strap lines to prevent punch through is also well known in the art. See U.S. Pat. No. 6,822,287.

SUMMARY OF THE INVENTION

Accordingly, in the present invention, a memory array comprises a plurality of memory cells, arranged in a plurality of rows and columns. Each cell has at least four terminals. The array has a plurality of column lines with each column line connected to the first terminals of cells in a different column. The array also has a plurality of first row lines, with each first row line connected to the second terminals of cells in a different row. The array also has a plurality of second row lines, with each second row lineconnected to the third terminals of cells in a different row.

Finally, the array has a plurality of third row lines with each third row line connected to the fourth terminals of cells in a different row. A column decoder is connected to the plurality of column lines. A first row decoder is connected to the plurality of first row lines. A second row decoder is connected to the plurality of second row lines. A third row decoder is connected to the plurality of third row lines. During an operation of a selected cell, the column decoder selects one of the plurality of column lines, with the one column line selected connected to the first terminal of the selected cell. The first row decoder selects one of the plurality of first row lines with the one first row line selected connected to the second terminal of the selected cell. The second row decoder selects a first plurality of second row lines, with one of the first plurality of second row lines connected to the third terminal of the selected cell. The third row decoder selects a second plurality of third row lines, with one of the second plurality of third row lines connected to the fourth terminal of the selected cell. Finally, the first plurality of second row lines, other than the one second row line, are connected to cells arranged in rows other than rows of cells to which the second plurality of third row lines are connected.

DETAILED DESCRIPTION OF THE INVENTION

Figure 4:
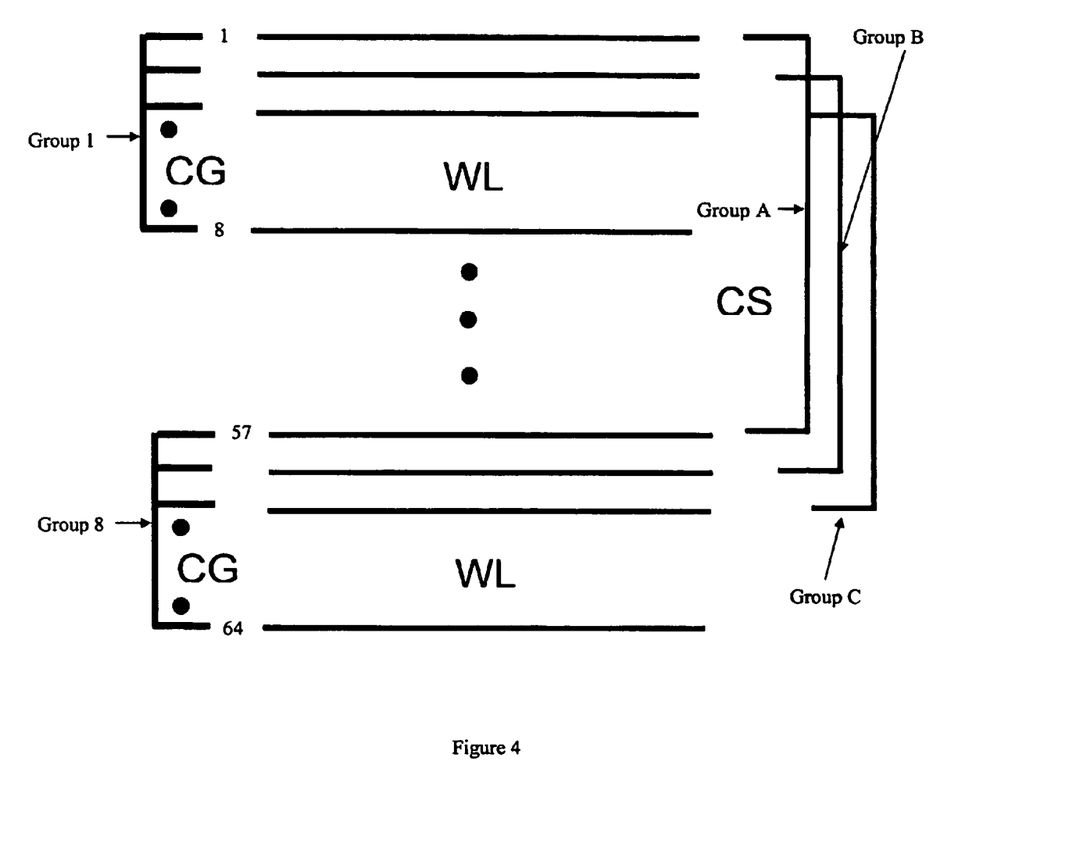
FIG. 4 is a partial schematic view of a first embodiment of the present invention showing the various lines connected to a selected memory cell.

Referring to FIG. 4, there is shown a partial schematic view of a first embodiment of the present invention showing the various lines connected to a selected memory cell of an array 10. The present invention can be used with the memory array 10 shown in FIG. 1 in which an array 10 of the cells 20 of the type shown in FIG. 2 are arranged in a plurality of rows and columns. A row decoder 50 provides the signals to activate certain of the word lines (WL) and certain of control gate (CG) lines. A common source decoder 60 receives an address signal and activates certain of the common source (CS) lines. Finally, a column decoder 40 receives an address signal and activates certain of the bit line (BL) lines. The only difference between the present invention and the memory array 10 shown and discussed in FIG. 1 is that during an operation, such as programming, the selection of the CG lines and CS lines are different. As discussed previously, during an operation such as programming, the column decoder 40 will select a particular BL for activation.

Further, the row decoder 50 will select a particular WL for activation. In the first embodiment of the present invention, similar to the prior art, the row decoder 50 also activates a plurality (such as 8) of contiguous CG lines, in response to an address signal. However, unlike the prior art, in response to the same address signal, a different set of 8 CS lines are activated. In particular, only 1 of the eight activated CS lines is connected to memory cells that lie in a row which is also activated by the 8 activated CG lines. An example the foregoing is as follows:

Assume that there are 64 WL, lines, 64 CG lines, and 64 CS lines, number 1 through 64. Assume further that each group of activated CG lines and activated CS lines is 8. The grouping of activation of the CG lines is as follows:

| | |
|---|---|
| Group 1: | CG lines: 1,2,3,4,5,6,7,8 |
| Group 2: | CG lines: 9–16 |
| Group 3: | CG lines: 17–24 |
| . . . | . . . |
| Group 8: | CG lines: 57–64 |

The grouping of the CS lines is as follows:

| | |
|---|---|
| Group A: | CS lines: 1,9,17, . . . 57 |
| Group B: | CS lines 2,10,18 . . . 58 |
| Group C: | CS lines 3,11,19 . . . 59 |
| . . . | . . . |
| Group H: | CG lines: 8,16,24 . . . 64 |

Thus, for example, to activate the memory cell 20 in WL 3, Group 1 of the CG lines and Group C of the CS lines are chosen. The resultant voltages to the selected memory cell 20 (for the example of the operation of programming, to the same cell as described heretofore) is Selected cell (e.g. in WL=3): BL=0.4 v; WL=2.0v; CG=10.5 v; CS=4.5 v The program disturbance to memory cells 20 in the same row as the selected memory cell but with a different column is as follows (using the same voltage described heretofore for the operation of programming):

Non-selected cell in the same row (e.g. WL=3): BL=Vcc-Vth v; WL=2.0v; CG=10.5 v; CS=4.5 v The program disturbance is the same as the program disturbance to cell B described in the prior art, which is less than the program disturbance to cell A of the prior art.

The program disturbance to a memory cell which is in a row activated by an active CG line but not in the selected row is as follows:

Non-selected cell in a different row (e.g. WL=4): BL=Vcc-Vth v; WL=0.0v; CG=10.5 v; CS=0.0v Finally, the program disturbance to a row activated by an active CS line and not activated by a CG line is as follows:

Non-selected cell in a different row (e.g. WL=11): BL=Vcc-Vth v; WL=0.0v; CG=0.0 v; CS=4.5 v The disturbances to these non-selected memory cells is less than the disturbance to the memory cell A of the prior art.

Figure 5:
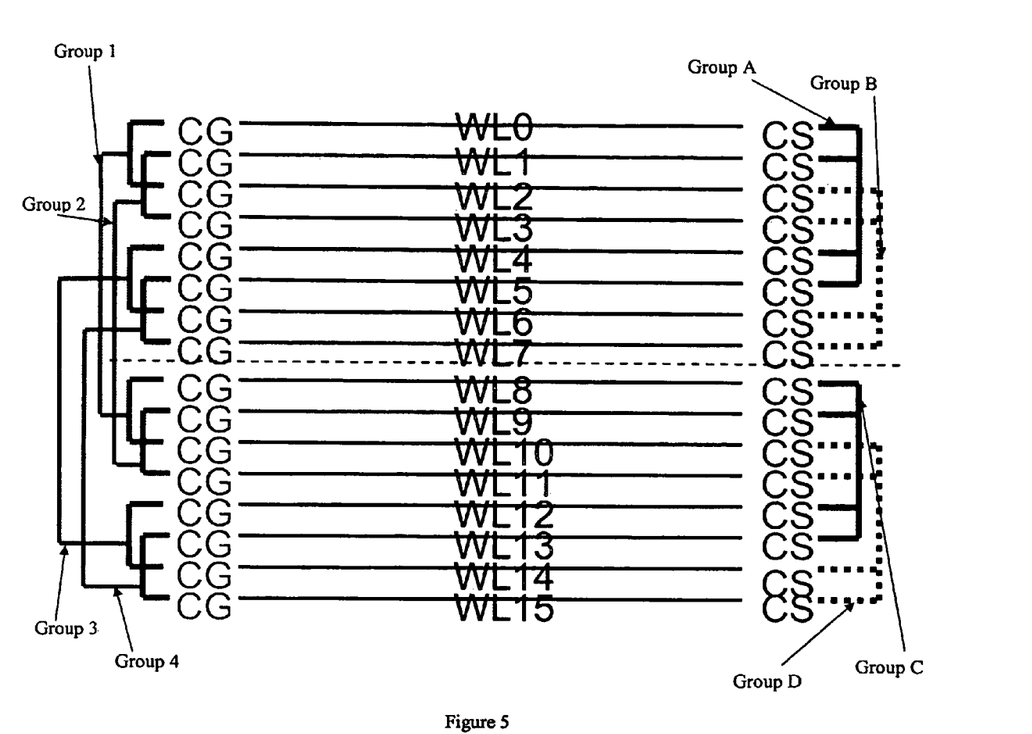
FIG. 5 is a partial schematic view of a second embodiment of the present invention showing the various lines connected to a selected memory cell.

Referring to FIG. 5 there is shown a partial schematic view of a second embodiment of the present invention. In this embodiment during an operation, a group of 4 CG lines and 4 CS lines are selected. Assume that a sector has 8 WL lines, the group of CG lines selected would be the first and third CG lines of two sectors (which can be adjacent and contiguous, or non-contiguous) connected together. A second group would be the second and fourth CG lines of two sectors connected together. A third group would be the fifth and seventh CG lines of two sectors connected together. A fourth group would be the sixth and eight CG lines of two sectors connected together. The groups of CS lines are as follows. A first group of CS lines are the first second fifth and sixth CS lines of one sector. A second group is the third, fourth, seventh and eight CS lines of the same sector. A third group of CS lines are the first second fifth and sixth CS lines of another sector. A fourth group is the third, fourth, seventh and eight CS lines of the same sector.

Thus, one example of the grouping of the CG lines and CS lines during an operation, such as programming, is as follows. Assume that there are 16 WL, lines, 16 CG lines, and 16 CS lines, number 1 through 16. Assume further that each group of activated CG lines and activated CS lines is 4. The grouping of activation of the CG lines is as follows:

| | |
|---|---|
| Group 1: | CG lines: 1,3,9,11 |
| Group 2: | CG lines: 2,4,10,12 |
| Group 3: | CG lines: 5,7,13,15 |
| Group 4: | CG lines: 6,8,14,16 |

The grouping of the CS lines is as follows:

| | |
|---|---|
| Group A: | CS lines: 1,2,5,6 |
| Group B: | CS lines: 3,4,7,8 |
| Group C: | CS lines: 9,10,13,14 |
| Group D: | CG lines: 11,12,15,16 |

Thus, for example, to activate the memory cell 20 in WL 3, Group 1 of the CG lines and Group B of the CS lines are chosen. The resultant voltages to the selected memory cell 20 (for the example of the operation of programming, to the same cell as described heretofore) and the non-selected memory cells are the same as discussed for the embodiment shown in FIG. 4.

Figure 6:
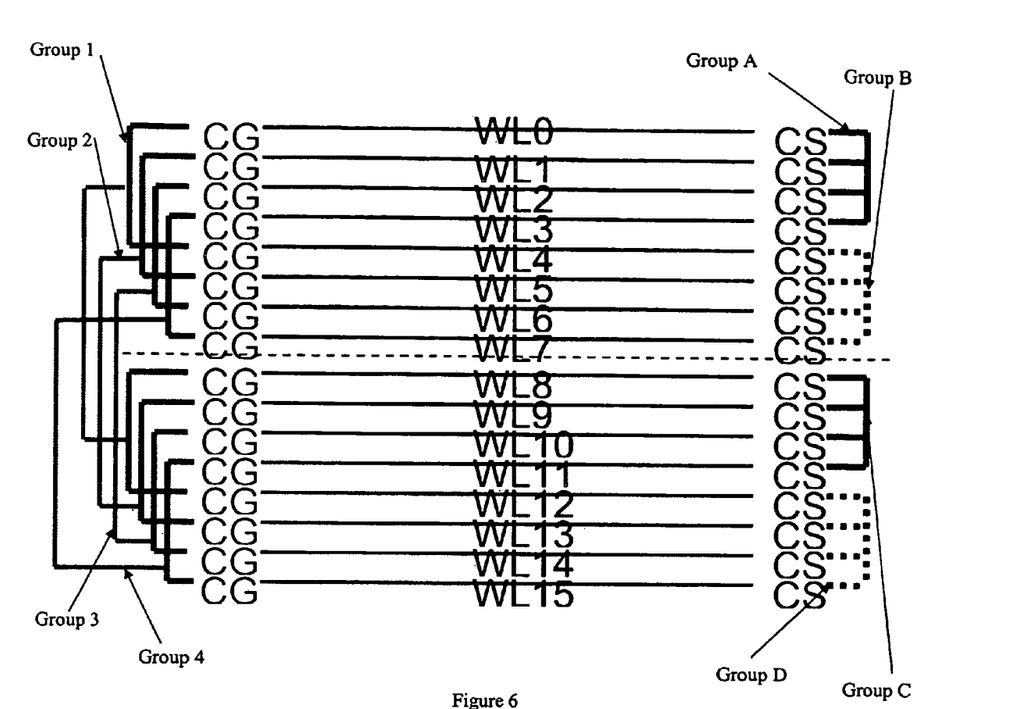
FIG. 6 is a partial schematic view of a third embodiment of the present invention showing the various lines connected to a selected memory cell.

Referring to FIG. 6 there is shown a partial schematic view of a third embodiment of the present invention. Here again, similar to the second embodiment, a group of CG lines and a group of CS lines selected for activation during an operation consist of 4 CG lines and 4 CS lines. Again, if we define a sector as 8 WL lines, then a first group of CG lines consist of the first and fifth CG lines of one sector. connected together and to the first and fifth of another sector, which can be immediately contiguous or non-contiguous. A second group of CG lines is the second and sixth CG line of two sectors connected together. A third group would be the third and seventh CG lines of two sectors connected together. A fourth group is the fourth and eighth CG lines of two sectors connected together. A first group of CS lines that are connected together are the first through four CS lines of a sector. A second group of CS lines are the fifth through eighth CS lines of a sector. A third group of CS lines are the first through four CS lines of another sector. A fourth group of CS lines are the fifth through eighth CS lines of another sector.

One example of the operation (such as programming) of the array 10 with these groupings of the CG and CS lines is as follows. Assume that there are 16 WL, lines, 16 CG lines, and 16 CS lines, number 1 through 16. Assume further that each group of activated CG lines and activated CS lines is 4. The grouping of activation of the CG lines is as follows:

| | |
|---|---|
| Group 1: | CG lines: 1,5,9,13 |
| Group 2: | CG lines: 2,6,10,14 |
| Group 3: | CG lines: 3,7,11,15 |
| Group 4: | CG lines: 4,8,12,16 |

The grouping of the CS lines is as follows:

| | |
|---|---|
| Group A: | CS lines: 1,2,3,4 |
| Group B: | CS lines: 5,6,7,8 |
| Group C: | CS lines: 9,10,11,12 |
| Group D: | CG lines: 13,14,15,16 |

Thus, for example, to activate the memory cell 20 in WL 3, Group 3 of the CG lines and Group A of the CS lines are chosen. The resultant voltages to the selected memory cell 20 (for the example of the operation of programming, to the same cell as described heretofore) and the non-selected memory cells are the same as discussed for the embodiment shown in FIGS. 4 and 5.

As can be seen from the foregoing, by simply altering the selection of the particular CG lines and CS lines, programming or operational disturbance can be minimized. The invention can be applied to any type of multi-terminal (>3) memory cells for any type of operation where the disturbance to the operation is to be minimized. Further similar to the prior art, the row decoder 50 to decode the signals to activate the groups of CG or CS cells can be the same decoder as that which selects the particular WL line to activate a selected memory cell.

What is claimed is:
1. A memory array comprising:
   a plurality of memory cells, arranged in a plurality of rows and columns, wherein each cell has at least four terminals;
   a plurality of column lines with each column line connected to a first terminal of cells in a different column;
   a plurality of first row lines, with each first row line connected to a second terminal of cells in a different row;
   a plurality of second row lines, with each second row line connected to a third terminal of cells in a different row;
   a plurality of third row lines with each third row line connected to a fourth terminal of cells in a different row;
   a column decoder connected to said plurality of column lines;
   a first row decoder connected to said plurality of first row lines;
   a second row decoder connected to said plurality of second row lines;
   a third row decoder connected to said plurality of third row lines;
   wherein during an operation of a selected cell, said column decoder selects one of said plurality of column lines, said one column line selected is connected to the first terminal of the selected cell;
   said first row decoder selects one of said plurality of first row lines, said one first row line selected is connected to the second terminal of the selected cell;

said second row decoder selects a first plurality of second row lines, one of said first plurality of second row lines is connected to the third terminal of the selected cell;

said third row decoder selects a second plurality of third row lines, one of said second plurality of third row lines is connected to the fourth terminal of the selected cell; and wherein the first plurality of second row lines, other than the one second row line, are connected to cells arranged in rows other than rows of cells to which the second plurality of third row lines are connected.

2. The memory array of claim 1 wherein each cell is a non-volatile memory cell.

3. The memory array of claim 2 wherein each cell is a non-volatile memory cell of the floating gate type.

4. The memory array of claim 1 wherein the first row decoder, the second row decoder, and the third row decoder are all the same row decoder.

5. The memory array of claim 1 wherein the first row decoder, the second row decoder, and the third row decoder are all different row decoders.

6. The memory array of claim 3 wherein each memory cell is made in a semiconductor substrate of a first conductivity type with a first region of a second conductivity type in the substrate, and a second region of the second conductivity type in the substrate, spaced apart from the first region, defining a channel region there between; a floating gate insulated from a portion of the channel region; a control gate insulated from another portion of the channel region, and a coupling gate capacitively coupled to the floating gate and stacked on the floating gate, wherein the first terminal of the cell is the first region, the second terminal of the cell is the control gate, the third terminal of the cell is the second region, and the fourth terminal of the cell is the coupling gate.

7. The memory array of claim 6 wherein the operation is the programming of the selected cell.

8. A method of reducing programming disturbance in a non-volatile memory cell array having a plurality of non-volatile memory cells arranged in a plurality of rows and columns; wherein each cell has at least four terminals; a plurality of column lines with each column line connected to a first terminal of cells in a different column; a plurality of first row lines, with each first row line connected to a second terminal of cells in a different row; a plurality of second row lines, with each second row line connected to a third terminal of cells in a different row; a plurality of third row lines, with each third row line connected to a fourth terminal of cells in a different row; a column decoder connected to the plurality of column lines; a first row decoder connected to the plurality of first row lines; a second row decoder connected to the plurality of second row lines; a third row decoder connected to the plurality of fourth row lines; wherein said method comprising:

selecting one of the plurality of column lines, wherein the one selected column line is connected to the first terminal of a column of cells including the selected cell;

selecting one of the plurality of first row lines, wherein the one selected first row line is connected to the second terminal of a row of cells including the selected cell;

selecting a first plurality of second row lines, wherein one of the first plurality is connected to the third terminal of a row of cells including the selected cell;

selecting a second plurality of third row lines, wherein one of the second plurality is connected to the fourth terminal of a row of cells including the selected cell; and wherein the rows of memory cells connected by the first plurality and the rows of memory cells connected by the second plurality have only one row of memory cells in common, with said one row of memory cells in common containing the selected memory cell.

9. The method of claim 8 wherein the first plurality of row lines are interleafed with the second plurality of row lines.

10. A non-volatile memory array comprising:

a plurality of non-volatile memory cells, arranged in a plurality of rows and columns, wherein each non-volatile memory cell having at least four terminals;

a plurality of column lines with each column line connected to a first terminal of cells in a different column;

a plurality of first row lines, with each first row line connected to a second terminal of cells in a different row;

a plurality of second row lines, with each second row line connected to a third terminal of cells in a different row;

a plurality of third row lines with each third row line connected to a fourth terminal of cells in a different row;

a column decoder connected to said plurality of column lines;

a first row decoder connected to said plurality of first row lines;

a second row decoder connected to said plurality of second row lines;

a third row decoder connected to said plurality of third row lines;

wherein during programming of a selected cell, said column decoder selects one of said plurality of column lines, said one column line selected is connected to the first terminal of the selected cell;

said first row decoder selects one of said plurality of first row lines, said one first row line selected is connected to the second terminal of the selected cell;

said second row decoder selects a first plurality of second row lines, one of said first plurality of second row lines is connected to the third terminal of the selected cell;

said third row decoder selects a second plurality of third row lines, one of said second plurality of third row lines is connected to the fourth terminal of the selected cell; and wherein the rows of memory cells connected by the first plurality and the rows of memory cells connected by the second plurality have only one row of memory cells in common, with said one row of memory cells in common containing the selected memory cell.

11. The memory array of claim 10 wherein each memory cell is a non-volatile memory cell of the floating gate type.

12. The memory array of claim 11 wherein each memory cell is made in a semiconductor substrate of a first conductivity type with a first region of a second conductivity type in the substrate, and a second region of the second conductivity type in the substrate, spaced apart from the first region, defining a channel region there between; a floating gate insulated from a portion of the channel region; a control gate insulated from another portion of the channel region, and a coupling gate capacitively coupled to the floating gate and stacked on the floating gate, wherein the first terminal of the cell is the first region, the second terminal of the cell is the control gate, the third terminal of the cell is the second region, and the fourth terminal of the cell is the coupling gate.

13. The memory array of claim 10 wherein the first row decoder, the second row decoder, and the third row decoder are all the same row decoder.

14. The memory array of claim 10 wherein the first row decoder, the second row decoder, and the third row decoder are all different row decoders.

15. The memory array of claim 10 wherein the first plurality of row lines are interleaved with the second plurality of row lines.

* * * * *